United States Patent [19]

Kondo

[11] Patent Number: 5,420,505
[45] Date of Patent: May 30, 1995

[54] DIRECT CURRENT BOOSTER WITH TEST CIRCUIT

[75] Inventor: Ichiro Kondo, Tokyo, Japan

[73] Assignee: NEC Corporation, Tokyo, Japan

[21] Appl. No.: 32,995

[22] Filed: Mar. 18, 1993

[30] Foreign Application Priority Data

Mar. 23, 1992 [JP] Japan .................................. 4-064420

[51] Int. Cl.⁶ .............................................. G01R 31/00
[52] U.S. Cl. ................................. 324/158.1; 324/119
[58] Field of Search ................. 324/73.1, 158 R, 158.1, 324/119; 371/15.1, 22.3; 307/304, 310; 363/60, 61

[56] References Cited

U.S. PATENT DOCUMENTS

| | | | |
|---|---|---|---|
| 4,016,476 | 4/1977 | Morokawa et al. | 307/304 |
| 4,488,061 | 12/1984 | Mukawa et al. | 363/60 |
| 4,839,787 | 6/1989 | Kojima et al. | 363/60 |
| 4,922,403 | 5/1990 | Feller | 363/60 |
| 4,970,409 | 11/1990 | Wada et al. | 307/110 |

OTHER PUBLICATIONS

Kikuo Watanabe et al. "Time Dependent Di-Electric Breakdown of Thin Thermally Frown SiO₂ Films" *IEEE Transactions on Electron Devices,* vol. Ed 32, No. 2, Feb. 1985, pp. 423-428.

*Primary Examiner*—Vinh Nguyen

[57] ABSTRACT

A direct current booster device has a booster which includes a plurality of N-channel MOS field-effect transistors (FETs) each having a gate terminal and a drain terminal joined together and connected in series in the same direction from the input side to the output side, and a plurality of capacitors to which two boosting clock signals of an opposite phase are provided, which are generated by a clock driver circuit and supplied alternately in a one-by-one corresponding relationship so that the two different boosting clock signals are inputted to each pair of adjacent gate-drain terminals of the FETs. A test circuit is provided, which has a plurality of N-channel MOS FETs, the source terminals of which are connected individually to the gate terminals of the FETs of the booster. The drain terminals of the MOS FETs of the test circuit are all connected in common to a test voltage supply terminal of the input unit for a testing voltage which is higher than a maximum voltage generated by the booster and applied to the capacitors. The gate terminals of the MOS FETs of the test circuit are all connected in common to a control signal terminal of a switching unit to which a control signal of a voltage up to the test voltage is supplied.

9 Claims, 2 Drawing Sheets

DIRECT CURRENT BOOSTER WITH TEST CIRCUIT

BACKGROUND OF THE INVENTION

1. Field of the Invention

This invention relates to a direct current booster which generates a voltage higher than a power source voltage. More specifically, the present invention relates to, though is not particularly limited to, a direct current booster with a test circuit for supplying a higher voltage than a normal operating voltage as necessary foe altering the stored contents of a non-volatile storage device of a semiconductor integrated circuit, the stored contents of which are capable of being altered electrically. For example, such a booster would be capable of raising a normal operating voltage of DC 5 volts to a level of DC 10 to 25 volts.

2. Description of the Related Art

A conventional booster is described with reference to the circuit diagram of FIG. 1. The circuit shown includes a main booster including a plurality of booster stages connected in series in the same direction. Each of the booster stages includes one N-channel MOS semiconductor device 104 having the gate terminal and the drain terminal connected to each other so that it corresponds to a diode, and one capacitor 103 having a terminal connected to the junction between the gate and drain terminals of semiconductor device 104. The source terminal of semiconductor device 104 of each booster stage is connected to the junction between the gate and drain terminals of semiconductor device 104 of a next adjacent stage. The booster further includes a clock driver circuit 105 which generates two clock signals of opposite phase to each other from a single clock signal inputted from a booster cock input terminal 107 and supplies the thus generated clock signals in a one-by-one corresponding relationship to the terminals of other capacitors 103 so that two clock signals supplied to each adjacent capacitor 103 will be opposite in phase to each other. The booster further includes an input rectifier of an N-channel MOS semi-conductor device 102 having the gate terminal and the drain terminal connected to the input terminal 101 of the power source and having the source terminal connected to the junction of the gate and drain terminals of the first booster stage.

In operation, N-channel MOS semiconductor devices 102 and 104 pass the charge therethrough in only one direction, similarly to diodes, and the relationship in magnitude of the voltage between the drain-gate terminal and the source terminal are reversed alternately for the successive boosting stages by the clock signals of the opposite phases. Consequently, the voltage applied to input terminal 101 is successively boosted by the boosting stages so that a voltage higher than the input voltage is outputted from the output terminal 106.

It is known that time-dependent dielectric breakdown (hereinafter referred to as TDDB) occurs in oxide films obtained by oxidation of a silicon substrate by the thermal growing method. TDDB is investigated in Kikuo YAMABE et al., "Time-Dependent Dielectric Breakdown of Thin Thermally Grown SiO$_2$ Films" in IEEE Transactions on Electron Devices, Vol. Ed. 32, No. 2, Feb. 1985, pp. 423–428. According to this document, TDDB is categorized into three modes: A, B, and C mode. The A mode can be attributed to pinholes in the gate oxide because breakdown occurs when the electric field applied to the oxide film is lower than about 2 MeV/cm. The B mode is caused by weak spots in the oxide and occurs when the applied electric field is in the range of 4 to 7 MeV/cm. The C mode is a defectfree capacitor, and the applied electric field may range higher than 9 MeV/cm. Time T to B-mode breakdown decreases logarithmically with respect to electric field strength Eox MeV/cm and is given by log(T) = $-\beta$ Eox, where coefficient $\beta$ can be represented, with respect to thickness $T_{ox}$ in angstroms of the oxide film, by the relation:

$$\beta = 4.2 \times \log(T_{ox}) - 6.95 \pm 0.65$$

This signifies that if electric field strength $T_{ox}$ is increased by 1MeV/cm when the thickness $T_{ox}$ of the oxide film is 400 angstroms, time T to breakdown is decreased to $10^{-3.3}$ to $10^{-4.6}$ times.

Oxide films of gates or capacitors of ordinary semiconductor integrated circuits are designed so that the electric field to be applied to the opposite electrodes may be lower than 5 MeV/cm during use of the semiconductor integrated circuits. Capacitors of a conventional booster have a maximum capacity of approximately 10 pF. They are formed from an oxide film occupying a large area on a semiconductor integrated circuit, and a high voltage is applied to the capacitors. Accordingly, as a countermeasure to prevent breakdown of the capacitors, it is a common practice to make the thickness of a gate oxide film greater than the ordinary thickness of about 100 angstroms. When a voltage of for example, 20 volts is applied between the electrodes, the electric field strength corresponds to 5 MeV/cm where the thickness of the oxide film is 400 angstroms.

Accordingly, oxide film breakdown of the B mode occurs to a certain probability with capacitors 103 of the semiconductor integrated circuit to which a high voltage of about 20 volts is applied during operation of the booster, resulting in an interruption of operation of the booster. Therefore, it is a conventional practice to cause boosters to operate for a predetermined period of time before actual use in order to perform a screening test and remove products defective due to B mode failure.

However, since the voltage applied across each capacitor during operation of the booster is higher toward the output terminal 106 of the booster and is different at different boosting stages, and since the voltage to be generated during operation by the booster is set in advance to a limited level, there is a problem that screening tests of the booster are extremely time-consuming, and sufficient test results cannot be obtained.

SUMMARY OF THE INVENTION

It is an object of the present invention to provide a test circuit for a direct current booster which eliminates the problems described above and which can undergo a reliable screening test in a short time.

According to the present invention, a direct current booster with a test circuit comprises a plurality of rectifier elements connected in series so that current flows in the same direction from the input side to the output side, and a plurality of capacitors, each connected at one terminal thereof to the anode of a corresponding rectifier element and the other terminals thereof connected alternately to two boosting clock signals having phases opposite to each other so that boosting clock signals of opposite phase are inputted in a one-by-one corresponding relationship to each two adjacent anodes of the rectifier elements and generates an output of a direct current voltage higher than a voltage inputted from a power source. The booster further comprises a test circuit that includes testing voltage input means for inputting a voltage for a test other than the voltage of the power source, connecting means for connecting the input means to at least one of the anodes of the rectifier elements, and switching means for switching the testing voltage inputted by the input means.

Preferably, each of the rectifier elements is an MIS field-effect transistor having the drain terminal and the gate terminal joined together.

Preferably, the connecting means includes an field-effect transistor, and the test circuit may further include logical value changing means for changing the two clock signals to be inputted to the capacitors so as to have the same logical value.

The external controlling signals may be supplied to the switching means either directly or indirectly through the input means.

Thus, each terminal of the anode and capacitor connected to the input means can be supplied the testing voltage in addition to the ordinary voltage produced at the anode, and B-mode breakdown of the oxide film is accelerated.

In this way, the object of the present invention to provide a test circuit for a direct current booster which can perform a reliable screening test in a short time can be achieved.

The above and other objects, features, and advantages of the present invention will become apparent from the following description referring to the accompanying drawings which illustrate an example of the preferred embodiments of the present invention.

DESCRIPTION OF THE PREFERRED EMBODIMENTS

Figure 1:
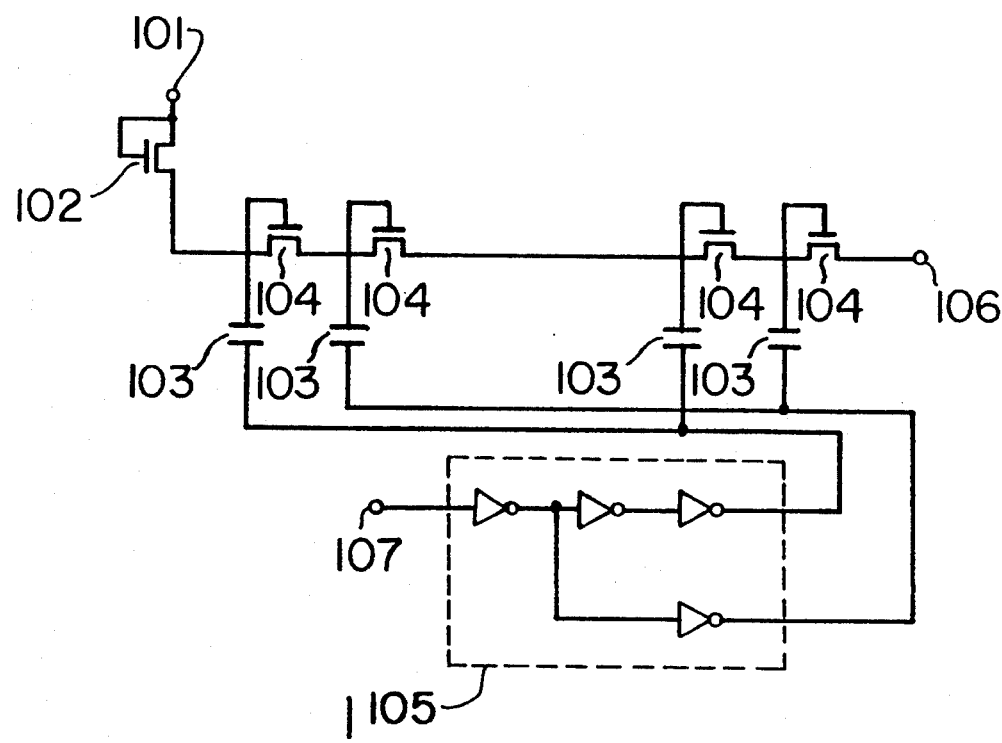
FIG. 1 is a circuit diagram showing an example of a conventional direct current booster.
Figure 2:
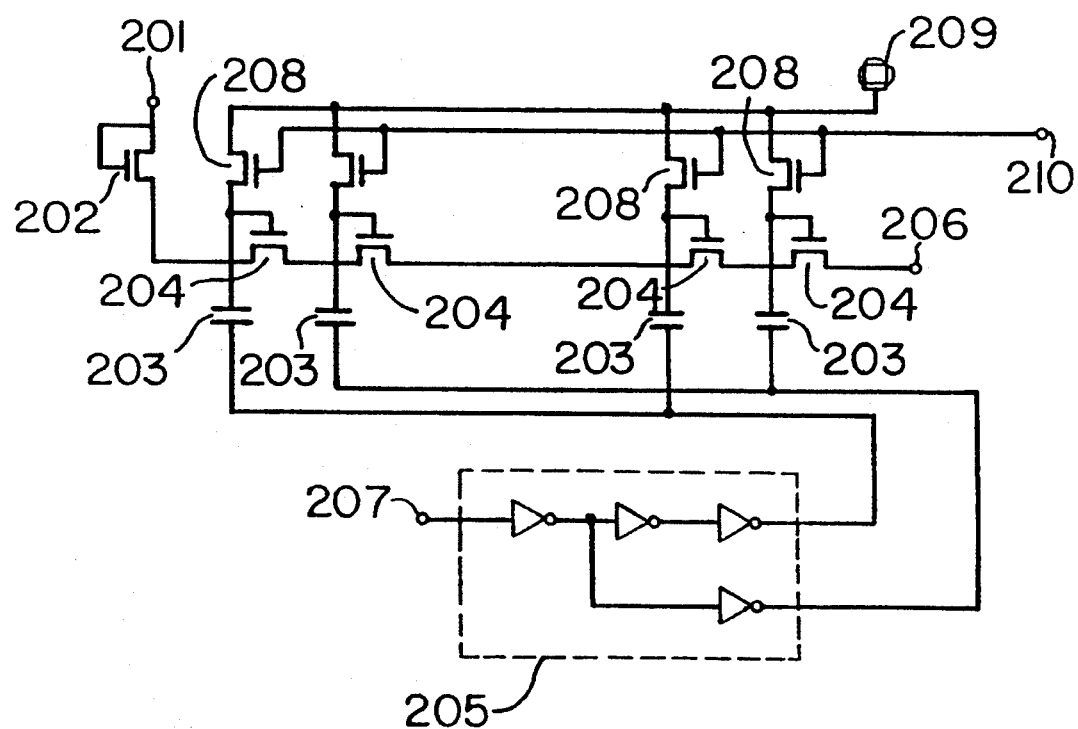
FIG. 2 is the circuit diagram of a first embodiment of a direct current booster of the present invention.

Referring to FIG. 2, the direct current booster of the first embodiment includes, similarly to the conventional booster described above, a plurality of N-channel MOS semiconductor devices 204 each having the gate terminal and the drain terminal joined together and connected in series in the same direction from the input side to the output terminal 206 side, and a plurality of capacitors 203 through which two boosting clock signals generated from the clock driver circuit 205 and having phases opposite to each other are supplied alternately in a one-by-one corresponding relationship to each of the adjacent semiconductor devices 204. The direct current booster of the present embodiment additionally includes a test circuit including connecting means of a plurality of N-channel MOS semiconductor devices 208, of which the source terminals are connected individually to the gate terminals of semiconductor devices 204, the drain terminals are all connected in con, on to the input means of the external testing voltage supply terminal 209, and the gate terminals are all connected in common to the switching means of the external control signal terminal 210.

In the present embodiment, the N-channel MOS semiconductor devices are all formed as N-channel MOS field-effect transistors.

In operation, when a voltage inputted as logical value H from the external control signal terminal 210 is equal to the voltage supplied from the testing voltage supply terminal 209, all of semiconductor devices 208 become conductive, and consequently, the voltage, which is lower than the value of the voltage supplied from terminal 209 by the voltage of the threshold level o semiconductor devices 208, is applied to the terminals of capacitors 203 connected to semiconductor devices 204. When the voltage of logical value H of control signal 210 is lower than the voltage supplied from the terminal 209, the voltage applied to the terminals of the capacitors 203 is lower than the voltage of logical value H by the value of the voltage of the threshold level of semiconductor devices 208. Accordingly, if a higher voltage than the voltages generated at the terminals of the capacitors 208 during operation of the booster is selected as the testing voltage inputted from terminal 209, the voltage for a screening test for B-mode failure can be increased within the allowable voltage resisting ranges of the N-channel MOS semiconductor devices 202, 204 and 208.

Figure 3:
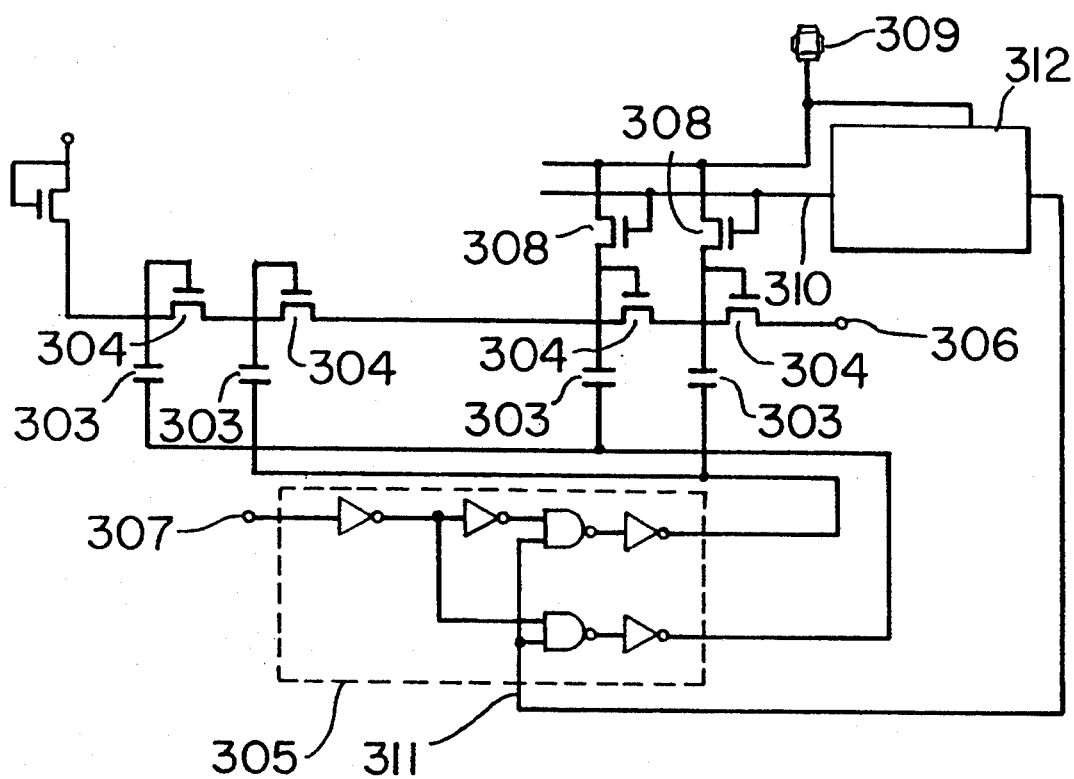
FIG. 3 is the circuit diagram of a second embodiment of a direct current booster of the present invention.
Figure 4:
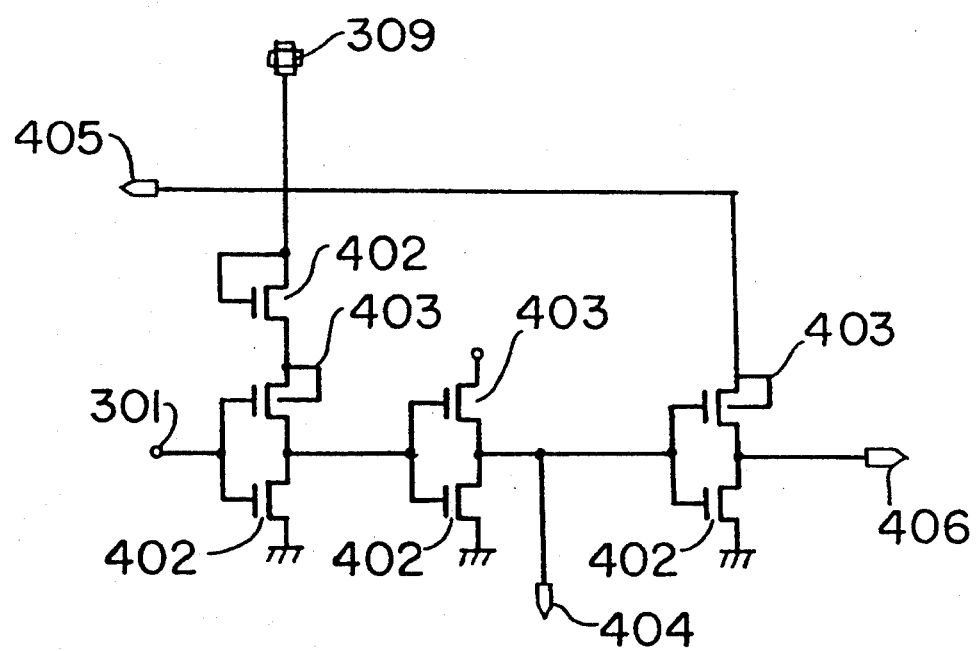
FIG. 4 is a circuit diagram showing an example of the external voltage detection circuit of FIG. 3.

The second embodiment of the present invention is shown in FIG. 3. The direct current booster of the present embodiment is different from the direct current booster of the first embodiment in that: semiconductor devices 308 of the test circuit are not connected to all of the capacitors 303 of the booster but only to several capacitors 303 adjacent the output terminal 306 to which a high voltage or voltages are applied; control signals 310 and 311 are generated by an external voltage detection circuit 312 (refer to FIG. 4) which detects that the voltage at the testing voltage supply terminal 309 exceeds a predetermined value, thereby eliminating the input terminal of an external control signal such as terminal 210 of FIG. 2; and it includes two 2-input NAND gates which input control signal 311 and a clock signal to make the outputs of the two clock signals of opposite phase always at a logic level L. Operation of the booster itself is the same as that of the booster of the first embodiment.

The number of semiconductor devices 308 may be suitably determined from the number of capacitors 303 having insulator films to which a voltage higher than 3 MeV/cm is applied. In this way, the number of elements of connecting means for the test circuit can be reduced. Meanwhile, control signal 311 sets the two outputs of the clock driver circuit 305 at a logical value L whether the logical value of the input from the boosting clock input 307 is H or L, and consequently, the voltage of the test circuit can be applied efficiently to the oxide films of the capacitors 303.

By applying voltages that are higher the voltage to be generated by the booster to capacitors 203 or 303 of the direct current booster in the manner described above, the time required for a screening test of the direct current booster can be reduced. In particular, when a booster circuit from which an output voltage of 20 volts can be obtained is used to perform a screening test, the electric field applied to an oxide film of 400 angstroms is 5 MeV/cm, but if voltage is applied from the external voltage supply terminal to apply a voltage of 22 volts to the electrodes of the capacitors, the strength of the electric field increases to 5.5 MeV/cm. Thus, according to the document referred to above, the time required for a screening test is decreased to about 1/50.

It is to be understood that variations and modifications of the direct current booster with test circuit disclosed herein will be evident to those skilled in the art. It is intended that all such modifications and variations be included within the scope of the appended claims.

I claim:

1. A direct current booster with comprising a test circuit; and a booster circuit including a plurality of rectifier elements connected in series so that current flows in the same direction of anode-to-cathode from an input side to an output side, a clock driver, and a plurality of capacitors each having one terminal connected to the anode of a corresponding one of said rectifier elements and having the other terminals thereof connected to said clock driver to receive therefrom alternatively two boosting clock signals of an opposite phase such that the boosting clock signals of the opposite phase are inputted through said capacitors in a one-by-one corresponding relationship to each two adjacent anodes of said rectifier elements, said booster circuit generating an output of a direct current voltage higher than a voltage inputted to said booster circuit from a power source, said test circuit including:
   an external testing voltage input means for inputting a voltage for a test other than the voltage of said power source;
   means for connecting said testing voltage input means to at least one of the anodes of said rectifier elements; and
   switching control signal generating means, coupled to said connecting means, for applying an external control signal to said connecting means so that a testing voltage is supplied to said at least one of the anodes of said rectifier elements in dependence on said control signal.

2. A direct current booster as claimed in claim 1, wherein each of said rectifier elements is an MIS field-effect transistor having a drain terminal and a gate terminal joined together.

3. A direct current booster as claimed in claim 2, wherein said connecting means includes at least one MIS field-effect transistor.

4. A direct current booster as claimed in claim 1, wherein said test circuit further includes logical value changing means at said clock driver for changing said two clock signals to be inputted through said capacitors to said adjacent anodes of said rectifier elements such that the two clock signals have the same logical value.

5. A direct current booster as claimed in claim 1, wherein said connecting means is controlled by the external control signal.

6. A direct current booster as claimed in claim 5, wherein said control signal generating means includes a detection circuit coupled to said external testing voltage input means.

7. A direct current booster as claimed in claim 1, wherein said connecting means is controlled by said external testing voltage input means.

8. A direct current booster comprising a test circuit; and a booster circuit including a plurality of rectifier elements connected in series so that current flows in the same direction of anode-to-cathode from an input side to an output side, a clock driver, and a plurality of capacitors each having one terminal connected to the anode of a corresponding one of said rectifier elements and having the other terminals thereof connected to said clock driver to receive therefrom alternatively two boosting clock signals of an opposite phase such that the boosting clock signals of the opposite phase are inputted through said capacitors in a one-by-one corresponding relationship to each two adjacent anodes of said rectifier elements, said booster circuit generating an output of a direct current voltage higher than a voltage inputted to said booster circuit from a power source, said test circuit including:
   an external testing voltage input means for inputting a voltage for a test other than the voltage of said power source;
   an external testing voltage detection circuit, coupled to said external testing voltage input means, for generting a control signal in response to detection that a voltage at said input means exceeds a predetermined value; and
   semiconductor connectng means, coupled to said input means and said detection circuit, for supplying a testing voltage depending on said control siignal to at least one of the anodes of said rectifier elements.

9. A direct current booster as claimed in claim 8, wherein said semiconductor connecting means includes at least one MIS field-effect transistor.

* * * * *